United States Patent
Ifis et al.

(10) Patent No.: US 11,778,751 B2
(45) Date of Patent: Oct. 3, 2023

(54) COMPENSATING MISALIGNMENT OF COMPONENT CARRIER FEATURE BY MODIFYING TARGET DESIGN CONCERNING CORRELATED COMPONENT CARRIER FEATURE

(71) Applicant: AT&S Austria Technologie & Systemtechnik Aktiengesellschaft, Leoben (AT)

(72) Inventors: Abderrazzaq Ifis, Leoben (AT); Markus Leitgeb, Trofaiach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 192 days.

(21) Appl. No.: 17/247,151

(22) Filed: Dec. 1, 2020

(65) Prior Publication Data

US 2021/0174494 A1  Jun. 10, 2021

(30) Foreign Application Priority Data

Dec. 5, 2019 (EP) .................................... 19213917

(51) Int. Cl.
*G06K 9/00* (2022.01)
*H05K 3/30* (2006.01)
(Continued)

(52) U.S. Cl.
CPC ........... *H05K 3/303* (2013.01); *G06T 7/0006* (2013.01); *H05K 3/4638* (2013.01); *G06T 2207/30141* (2013.01); *H05K 2203/166* (2013.01)

(58) Field of Classification Search
CPC ........ G06T 7/0006; G06T 2207/30141; G06V 10/255; H05K 3/4638; H05K 2203/166;
(Continued)

(56) References Cited

U.S. PATENT DOCUMENTS

| 5,935,365 A | * | 8/1999 | Kobayashi | ............. | H01G 4/308 |
| | | | | | 156/289 |
| 9,243,894 B2 | * | 1/2016 | Yamauchi | ............. | G01B 11/14 |

(Continued)

FOREIGN PATENT DOCUMENTS

| EP | 0273703 A2 | 7/1988 |
| EP | 1111662 B1 | 12/2012 |
| WO | 2014071312 A1 | 5/2014 |

OTHER PUBLICATIONS

Tomezak, A; European Search Report in Application No. 19 21 3917; pp. 1-12; dated Jun. 9, 2020; European Patent Office; 80298, Munich, Germany.

*Primary Examiner* — Shervin K Nakhjavan

(74) *Attorney, Agent, or Firm* — Robert A. Blaha; Smith Tempel Blaha LLC

(57) ABSTRACT

A method of compensating misalignment during manufacturing laminate-type component carriers is disclosed. The method includes detecting an image of a region of interest of a component carrier structure during manufacturing the component carriers based on the component carrier structure, identifying a structural feature in the image of the region of interest showing misalignment with respect to a target design, and at least partially compensating the identified misalignment of the structural feature by modifying the target design of at least one correlated structural feature to be manufactured subsequently, wherein the at least one correlated structural feature is correlated to said structural feature showing misalignment.

19 Claims, 3 Drawing Sheets

(51) Int. Cl.
   *G06T 7/00* (2017.01)
   *H05K 3/46* (2006.01)
(58) Field of Classification Search
   CPC ............ H05K 1/0269; H05K 2203/16; H05K 2203/163; H05K 2203/167; H05K 2203/168; H05K 3/303; H05K 3/4611; H05K 3/0008; Y02P 70/50
   See application file for complete search history.

(56) References Cited

U.S. PATENT DOCUMENTS

| | | | |
|---|---|---|---|
| 9,429,527 B1* | 8/2016 | Hung | G06T 7/0006 |
| 9,990,455 B1* | 6/2018 | Sinivaara | G06F 30/392 |
| 10,667,387 B2* | 5/2020 | Riel | H05K 3/3421 |
| 2001/0030058 A1 | 10/2001 | Janecek | |
| 2002/0131632 A1* | 9/2002 | Vernackt | G06T 7/0002 382/294 |
| 2004/0175030 A1* | 9/2004 | Prince | G06T 7/44 382/150 |
| 2006/0207091 A1 | 9/2006 | Takahashi | |
| 2009/0244865 A1 | 10/2009 | Tanaka | |
| 2010/0168908 A1* | 7/2010 | Maeda | H01L 21/68 700/228 |
| 2011/0131806 A1* | 6/2011 | Ikawa | H04N 7/18 29/846 |
| 2013/0148878 A1* | 6/2013 | Lin | H01L 21/681 382/151 |
| 2014/0210993 A1* | 7/2014 | Butler | G06T 7/001 348/87 |
| 2014/0299367 A1 | 10/2014 | Imamura | |
| 2017/0221197 A1* | 8/2017 | Schmidtmann | G06T 7/0006 |
| 2017/0242955 A1* | 8/2017 | Ono | H01L 21/00 |
| 2018/0011398 A1* | 1/2018 | Tel | G03F 1/22 |
| 2018/0153064 A1 | 5/2018 | Zorn et al. | |
| 2018/0177086 A1 | 6/2018 | Abrial et al. | |
| 2018/0286033 A1* | 10/2018 | Ishiyama | G06V 20/80 |
| 2019/0096135 A1* | 3/2019 | Dal Mutto | G06T 7/0006 |
| 2022/0207689 A1* | 6/2022 | Lyles | G06T 7/30 |
| 2022/0281025 A1* | 9/2022 | Danielsen | B33Y 50/02 |

* cited by examiner

COMPENSATING MISALIGNMENT OF COMPONENT CARRIER FEATURE BY MODIFYING TARGET DESIGN CONCERNING CORRELATED COMPONENT CARRIER FEATURE

CROSS-REFERENCE TO RELATED APPLICATIONS

This application claims the benefit of the filing date of the European Patent Application No. 19213917.8 filed 5 Dec. 2019, the disclosure of which is hereby incorporated by reference.

TECHNICAL FIELD

Embodiments of the invention relate to a method of compensating misalignment during manufacturing laminate-type component carriers, an apparatus for compensating misalignment during manufacturing laminate-type component carriers, a computer-readable medium, and a program element.

Technological Background

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, proper alignment of constituents of a component carrier is an issue during manufacture. For instance, proper alignment accuracy is important when assembling a component in a cavity of a component carrier structure before connecting the component with one or more connection pads. An erroneous connection due to excessive misalignment may result in a loss of the functionality of the component carrier.

SUMMARY

There may be a need to enable manufacture of laminate-type component carriers with high spatial accuracy of structural features of the component carriers.

According to embodiments of the invention, a method of compensating misalignment during manufacturing laminate-type component carriers, an apparatus for compensating misalignment during manufacturing laminate-type component carriers, a computer-readable medium, and a program element according to the independent claims are provided.

According to an exemplary embodiment of the invention, a method of compensating misalignment during manufacturing laminate-type component carriers is provided, wherein the method comprises detecting an image of a region of interest of a component carrier structure during manufacturing the component carriers based on the component carrier structure, identifying a structural feature in the image of the region of interest showing misalignment with respect to a target design, and at least partially compensating the identified misalignment of the structural feature by modifying the target design of at least one correlated structural feature to be manufactured subsequently, wherein the at least one correlated structural feature is correlated to said structural feature showing misalignment.

According to another exemplary embodiment of the invention, an apparatus for compensating misalignment during manufacturing laminate-type component carriers is provided, wherein the apparatus comprises an image detection unit configured for detecting an image of a region of interest of a component carrier structure during manufacturing the component carriers based on the component carrier structure, an identification unit configured for identifying a structural feature in the image of the region of interest showing misalignment with respect to a predefined target design, and a compensation unit configured for at least partially compensating the identified misalignment of the structural feature by modifying the target design of at least one correlated structural feature to be manufactured subsequently, wherein the at least one correlated structural feature is correlated to said structural feature showing misalignment.

According to still another exemplary embodiment of the invention, a program element (for instance a software routine, in source code or in executable code) is provided, which, when being executed by a processor (such as a microprocessor or a CPU or a GPU or an artificial intelligence system or any other computing system), is adapted to control or carry out a method having the above mentioned features.

According to yet another exemplary embodiment of the invention, a computer-readable medium (for instance a CD, a DVD, a USB stick, a floppy disk or a hard disk) is provided, in which a computer program is stored which, when being executed by a processor (such as a microprocessor or a CPU), is modified to control or carry out a method having the above mentioned features. Exemplary embodiments also cover a software with the described functionality stored on a cloud.

Data processing which may be performed according to embodiments of the invention can be realized by a computer program, that is by software, or by using one or more special electronic optimization circuits, that is in hardware, or in hybrid form, that is by means of software components and hardware components.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers. Also mold panels and high-density redistribution structures may be covered by the term component carrier.

In the context of the present application, the term "component carrier structure" may particularly denote either a component carrier (such as a printed circuit board or an IC substrate) itself or a larger body (such as a panel or an array) of multiple component carriers or pre-forms thereof (for instance a semifinished product obtained during manufacturing component carriers individually or in a batch process).

In the context of the present application, the term "region of interest" may particularly denote a spatial region, in particular a surface region, of the component carrier structure at which a presently processed structural feature is located which may show misalignment which shall be compensated. In particular, the region of interest may be identical to a region scanned by an image detection unit of the apparatus or scanned during detecting the image by the method. In an embodiment, the region of interest is a dedicated part or sub-portion of the whole component carrier structure or the whole component carrier (for instance a more sensible region as compared to other regions, a high integration-density region, a portion being more prone to misalignment than other portions, etc.). However, in another embodiments, the region of interest can also be defined to cover the whole component carrier structure (for instance the whole panel). Thus, the region of interest may be only a sub-portion of the component carrier structure or may be the entire component carrier structure. Hence, a local misalignment may be brought and compensated in a global scale (for instance the compensation may extend over an entire card, an entire array or even an entire panel).

In the context of the present application, the term "structural feature" may particularly denote any physical attribute or characteristic of a component carrier structure being presently processed. For instance, such a physical attribute or characteristic may be a material section of the component carrier structure and/or a recess of the component carrier structure. In particular, such a structural feature may be an electrically conductive structure, for instance a plated structure, a portion of a patterned copper foil, a copper filled laser via, etc. In an embodiment, the structural feature may also be an electrically insulating structure. It is also possible that the structural feature is a component to be surface mounted on and/or embedded in the component carrier structure. Misalignment of one or more structural features of the component carrier structure may be compensated according to an exemplary embodiment.

In the context of the present application, the term "correlated structural feature" may particularly denote a further structural feature of the component carrier structure, which further structural feature is in structural and/or functional correlation with the aforementioned (in particular misaligned) structural feature. In particular, a virtual structural feature and a correlated virtual structural feature may be virtually correlated in a target design according to which the component carriers of the component carrier structure are to be manufactured. Additionally, a physical structural feature and a correlated physical structural feature may be physically correlated (in particular physically connected with each other) in actually manufactured component carriers of the component carrier structure. For instance, the structural feature and the correlated structural feature shall be electrically connected in the readily manufactured component carriers. For example, the structural feature can be an embedded electronic component and the correlated structural feature may be a pad which shall be electrically connected with the embedded electronic component for electrically contacting the latter. In yet another embodiment, the structural feature may be a prefabricated component carrier element.

In the context of the present application, the term "target design" may particularly denote a specification or a layout or a set of design rules defining properties of structural features of a component carrier to be manufactured on the basis of a component carrier structure. For example, such properties may include one, multiple or all of shape, dimension, position, orientation as well as angular characteristics of the structural features constituting the component carrier. In particular, a target design for manufacturing component carriers may include all data indicative of the layout of the component carriers to be manufactured. For example, the target design may be implemented as a data set or as a software element.

In the context of the present application, the term "misalignment" may particularly denote a spatial discrepancy between a target property (for instance a geometrical property according to a predefined theoretical or target design) and an actual property (for instance the actual or real geo-metrical property on the processed component carrier structure) of a structural feature.

According to an exemplary embodiment of the invention, a system of compensating a spatial misalignment (for instance a position shift) of a created structural feature (for instance an embedded component) during manufacture of a laminate-type (i.e. having a multi-layer stack connected by the application of heat and/or pressure) component carrier (for example a printed circuit board) by processing a component carrier structure (for example a panel) is provided. In an ideal case, such component carriers are manufactured complying with a predefined target design, for instance to meet a specification defined by a user. In practice, it may however happen that structural features deviate from said ideal target behavior in accordance with the target design, for instance show a spatial misalignment. According to exemplary embodiments of the invention, such a misalignment may be detected, for instance by optically inspecting a corresponding region of interest of the component carrier structure (wherein the region of interest may for example correspond to a part of a detected image). After having identified and determined a corresponding misalignment by comparing the actual spatial properties of the structural feature with the target properties in accordance with the target design, the target design may be adapted, corrected or modified in accordance with this misalignment for the subsequent processing, rather than correcting a positioning of the misaligned structural feature to meet the original target design. By taking this measure, the target design of one or more further structural features being correlated with the misaligned structural feature may be changed to thereby compensate for the misalignment without negative impact on the readily manufactured component carriers. Descriptively speaking, the misaligned structural feature may be redefined as being manufactured to meet the modified target design, which may be achieved by correspondingly modifying the target design concerning the one or more correlated features. Such an embodiment may allow precisely manufacturing component carriers without a difficult and time-consuming physical correction (for instance by removal and reassembly of the misaligned structural feature) of already formed structural features. In contrast to this, exemplary embodiments of the invention maintain the misaligned structural feature as it is and adapt the target properties of the one or more correlated features to be formed subsequently in accordance with the modification of the target design.

Descriptively speaking, an exemplary embodiment transforms a registration to a separate compensation process on data processing level instead of carrying out a cumbersome physical correction of already manufactured features. In other words, a correction of previous processing errors in terms of the manufacture of structural features can be carried out by starting or continuing the manufacturing process with a modified (in particular the best adapted) fitting design for the future manufacture of one or more structural features being correlated with the already formed misaligned structural feature. Advantageously, no design limitations need to be respected with such an approach, which allows a component carrier designer to flexibly react on any detected misalignment. Thus, a process may be provided which even complies with demanding accuracy requirements in terms of the manufacture of component carriers, for instance for embedding and fan-out applications.

In the following, further exemplary embodiments of the method, the apparatus, the computer-readable medium and the program element will be explained.

For example, the component carrier structure may be a laminate of multiple stacked electrically insulating layer structures and electrically conductive layer structures, in particular formed by applying mechanical pressure and/or thermal energy.

In an embodiment, the method comprises manufacturing the at least one correlated structural feature based on the modified target design. Thus, rather than physically correcting a misaligned structural feature, a correlated structural feature to be manufactured thereafter is redefined in the updated target design so as to partially or entirely compensate the detected misalignment of the misaligned feature. This provides for a quick and reliable compensation without the need of cumbersome post-processing.

In an embodiment, the method comprises manufacturing the at least one correlated structural feature in the region of interest. Thus, both the misaligned structural feature as well as the correlated feature may be located partially or entirely within the scanned region of interest. Hence, the compensation process may focus on the direct spatial environment of the misaligned feature in which the correlation between the structural properties of the misaligned feature and the correlated feature is usually most pronounced.

In an embodiment, the misalignment of the at least one structural feature comprises one or more of a positional displacement of the structural feature with respect to a target position according to the original target design, a rotational misalignment of the structural feature with respect to a target orientation in the original target design, and a tilting of the misaligned structural feature with respect to an angular characteristic as defined in the original target design. Hence, different kinds of spatial relations between spatial target properties and actual spatial properties of the misaligned feature(s) may be taken into account for the alignment or compensation.

In an embodiment, the method comprises identifying the misaligned structural feature in a presently processed layer structure of the component carrier structure, and at least partially compensating the misalignment by effecting formation of the correlated structural feature in a subsequently processed layer structure (in particular a next higher layer structure in relation to the presently processed layer structure) of the component carrier structure. In the context of the present application, the term "layer structure" may particularly denote a continuous layer, a patterned layer or a plurality of non-consecutive islands within a common plane. A layer structure may be electrically insulating and/or electrically conductive. For instance, in a scenario in which a certain layer stack is presently processed (for instance an electronic component is presently embedded in a cavity of a certain layer structure), the compensation of the target design may be determined for a subsequent higher layer (in which for instance a plated via shall be formed for contacting the previously embedded component). Thus, a misalignment of a structural feature in or on one layer structure may be compensated by redetermining or redefining a target design in a subsequently processed layer structure. In other words, the undesired misalignment of the misaligned structural feature may translate into an advantageous corresponding misalignment of the correlated structural feature in a subsequently processed layer structure.

In an embodiment, the method comprises iteratively repeating the identifying and the at least partially compensating for at least one further layer structure processed after processing the subsequently processed layer structure. In other words, an update of a target design to comply with misalignment of a presently manufactured layer structure may be carried out multiple times during forming further layer structures on the stack of the component carrier structure. Even for a complex built up, this combines a fast processing and a high accuracy. Preferably, misalignment identification of a structural feature and correspondingly updating a target design before creating a further structural feature being correlated with the misaligned structural feature may be carried out after each layer formation of a multi-layer component carrier.

In an embodiment, the method comprises compensating by modifying the target design exclusively within the region of interest, not in other regions of the component carrier structure. By limiting the redetermination or updating of the target design for misalignment compensation to the region of interest in which also the misaligned structural feature is located by scanning, the computational burden in terms of misalignment compensation can be kept very small. This allows to carry out the compensation in real time and thus without delay of the manufacturing process.

In another embodiment, the method comprises compensating by modifying the target design in a spatially extended region of the component carrier structure extending beyond the region of interest. For example, the extended region may be a quarter panel. Thus, in said alternative advantageous embodiment, the re-determination of the target design may be extended beyond the spatial limits of the region of interest in which the misaligned structural features are located to thereby also consider and compensate an impact of the detected misalignment on one or more surface regions of the component carrier structure located in an environment of the region of interest. For instance, an erroneously located embedded component may not only influence the position of a pad and/or plated through hole of a higher layer structure contacting said embedded component, but may also influence spatial properties of an electrically conductive trace connecting to said pad and/or plated through hole, for instance for transporting electric signals and/or heat to and/or away from the embedded component. Thus, the redetermination of the target design may be extended beyond the limits of the region of interest to one or more other regions of the component carrier structure which are influenced by the misalignment and its compensation.

In an embodiment, the method comprises identifying the misalignment based on the results of comparing an original target design of the misaligned structural feature with an actual design of the structural feature in the region of interest. Such a comparison between actual spatial properties of a misaligned structural feature (as detected by an image detection unit) and target spatial properties of a virtual structural feature of a component carrier to be manufactured (as defined by the target design) may be carried out with low computational effort and thus highly precisely (in particular since it may be not necessary to scan and analyze the entire structural feature (for instance a component feature), but only limited analysis—such as rotation and shift of the structural feature—may be sufficient as a basis for determining a compensation). The redefinition of the target design may thus be rendered highly accurate and the manufacturing process quick and precise.

In an embodiment, the misaligned structural feature is a component to be embedded, and the correlated structural feature is a connection pad or a vertical through connection for electrically connecting the embedded component. Hence, even in the event of spatial inaccuracies of embedding the component in a cavity of the layer stack of the component carrier structure, such an artefact may be compensated by correspondingly modifying a target position of an electrically conductive contact structure to be formed subsequently for electrically connecting the embedded component.

In an embodiment, the misaligned structural feature is a plated through-hole, and the correlated structural feature is an electrically conductive trace or a pad. When a pad or land is to be formed for connecting a previously formed vertical through connection, detection of an inaccuracy or misalignment of said vertical through correction may be used as information allowing to recalculate a target position of the pad or land. Thus, the pad or land may be formed with lower area while nevertheless ensuring a proper connection to the misaligned vertical through connection.

In an embodiment, the misaligned structural feature is a high-density integration portion, and the correlated structural feature is a connected electrically conductive layer structure. In the context of the present application, the term "high-density integration" (HDI) portion of a stack may particularly denote a region of the stack in which a number of electrically conductive features per volume is higher than in another portion of the stack (which may then be denoted as a "low density integration" portion). When determining a misalignment in such an HDI region of the stack with its tiny electrically conductive substructures, even a small misalignment may have a significant impact on the functionality of the manufactured component carriers. Thus, the consideration of such a misalignment for the subsequent formation of electrically conductive contact structures for contacting said high-density integration region on the basis of a redefined target design may be highly advantageous. In particular, this may be combined with a previous, simultaneous and/or subsequent alignment marker-based alignment process. However, it should be mentioned that other exemplary embodiments may also be applied to component carriers and component carrier structures having the same diameter everywhere, i.e. having copper plating uniformity.

In an embodiment, the method comprises compensating the misalignment during processing the component carrier structure by at least one of the group consisting of imaging, in particular photoimaging, solder mask treatment, screen printing, via formation (for instance physically, mechanically or chemically) and mechanically treating, in particular by drilling and/or in an assembly process, the component carrier structure. However, also other manufacturing processes in terms of component carrier manufacture may be involved in the manufacture and the misalignment compensation process, since the mentioned and other manufacturing processes can be defined on the basis of parameters of a target design which can be adapted dynamically to comply with a detected misalignment.

In an embodiment, the method comprises additionally aligning structural features of the component carrier structure based on one or alignment markers of the component carrier structure. In the context of the present application, the term "alignment marker" may particularly denote a structural or physical feature of a component carrier structure which can be detected, optically inspected, inspected by X-rays or computed tomography (CT) or seen visually on a surface, in a surface region or in an interior of the component carrier structure (in particular a preform of a component carrier such as a printed circuit board). Alignment markers (in particular global and/or local alignment markers) may be used as a basis for an alignment to be carried out in terms of processing the component carrier structure, in particular by a processing machine which can use alignment marker for spatial orientation. For instance, such an alignment marker may be a nonfunctional through hole or blind hole or pad on and/or in the component carrier structure which can be optically inspected so as to determine position and/or orientation of the component carrier structure, such as a preform of the component carrier (for instance a panel). For example, a number of such holes and pads may be provided as alignment markers in edge regions of a rectangular component carrier structure such as a panel. One or both opposing main surfaces and/or an interior of the component carrier structure may be provided with alignment markers. For example, alignment markers may be skiving marks, corners (for instance of a rectangular electric device), and laser targets. Also, registration dies (glass, TSV, etc.) may be used as alignment markers. Highly advantageously, the concept of aligning using alignment marks may be synergistically combined with the updating of a target design in response to a detected misalignment of the structural feature. This may further increase the accuracy of the manufactured component carriers.

In an embodiment, the method comprises aligning the component carrier structure for forming the structural feature and/or for forming the correlated structural feature. Thus, for forming the structural feature (for instance for embedding a component in a cavity), one or more alignment marks of the component carrier structure may be detected by an optical detector, for example the same optical detector which is also used as image detection unit for detecting the misalignment of the structural feature. Based on the information derived from detection of the one or more alignment marks, misalignment of the structural feature may be kept relatively small. In combination with the subsequent modification of the target design following the determination of misalignment of the structural feature, the overall precision of the manufacturing process may be further improved. Additionally or alternatively, also the subsequent formation of the correlated structural feature may be carried out using knowledge concerning at least one alignment mark of the component carrier structure.

In an embodiment, the method redefines the misaligned structural feature as complying with a target alignment according to the modified design. Thus, the misaligned structural feature may be redefined in the modified design as a structural feature being formed in full agreement with a corresponding specification in the changed target design.

In an embodiment, the misalignment compensation method is carried out on panel level, using a panel as component carrier structure, before separating the panel into the individual component carriers. For instance, such a panel may have a dimension of at least 12 inches×18 inches or at least 18 inches×24 inches or from 510×515 $mm^2$ up to 600×600 $mm^2$. The component carriers may hence be manufactured as a batch, and therefore highly efficiently. Consequently, also the identification of misalignment and the compensation by updating a target design may be carried out on panel level and thus quickly and on an industrial scale. Alternatively, it is also possible to carry out the method on array level.

In an embodiment, identifying the structural feature showing the misalignment comprises determining a shift and a rotation of the structural feature in a cavity of the component carrier structure with respect to the target design. Such a shift may be for instance a displacement of a center of the misaligned structural feature (for instance a component to be embedded) as compared to a target position of the center according to the target design. The mentioned rotation may be for instance an angular misalignment of the structural feature (for instance a component to be embedded) as compared to a target orientation (for instance with edges being parallel to edges of a rectangle cavity) of the structural feature according to the target design.

In an embodiment, at least partially compensating the identified misalignment comprises modifying the target design for at least partially compensating said shift and said rotation. Thus, correction of only two design parameters (i.e. shift and rotation) may be sufficient to compensate at least a major portion of misalignment.

In an embodiment, the method comprises laminating at least one further layer structure to the component carrier structure after the compensating. Thus, the identification of the misalignment and the correction thereof may be carried out during the lamination sequence, i.e. during build-up.

In an embodiment, the method comprises at least partially compensating the identified misalignment of the structural feature by modifying the target design by at least one of the group consisting a compensating positional shift, a compensating rotation, and a compensating tilting of the at least one correlated structural feature. Hence, the modification of the target design concerning the correlated feature may be or include a shift, a rotation and/or a tilting.

In an embodiment, the method comprises aligning and processing the component carrier structure in accordance with the derived compensation of the design. In particular, processing the component carrier structure may comprise at least one of the group consisting of imaging (in particular photoimaging), solder mask treatment, screen printing, and via formation (in particular by drilling and/or in an assembly process) the component carrier structure. These and other procedures require a precise alignment of the component carrier structure to be processed.

In an embodiment, the component carrier structure is selected from a group consisting of a panel for manufacturing component carriers, an array of multiple component carriers or preforms thereof, and a component carrier for carrying at least one component. In a preferred embodiment, a PCB panel may be treated with the described alignment or misalignment compensation concept.

In an embodiment, the method comprises manufacturing the at least one correlated structural feature based on the modified target design by laser direct imaging (LDI). Thus, the method may be carried out using and the apparatus may comprise a laser direct imaging device. LDI may use a component carrier structure with a photosensitive surface, positioned under a controllable laser. A control unit scans the component carrier structure into a raster image. Matching the raster image to a predefined metallic pattern corresponding to the modified target design of the component carrier structure allows operating the laser to directly generate the image corresponding to the at least one correlated structural feature to be produced on said component carrier structure. Advantageously, a highly accurate correlated structural feature may be formed by LDI. Moreover, LDI is ideally suited for quickly producing a correlated structural feature in accordance with a modified target design.

In an embodiment, the component carrier structure and/or its component carriers being presently manufactured comprise(s) a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact in a vertical direction. The stack may be a laminated stack, i.e. formed by connecting its layer structures by the application of heat and/or pressure.

In an embodiment, the component carrier structure and/or its component carriers being presently manufactured is/are shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier structure and/or its component carriers being presently manufactured is/are configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one of the electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier structure and/or its component carriers being presently manufactured is/are a laminate-type component carrier. In such an embodiment, the component carrier (structure) is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating layer (for instance solder resist or BU (build-up) materials) may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF THE ILLUSTRATED EMBODIMENTS

Figure 1:
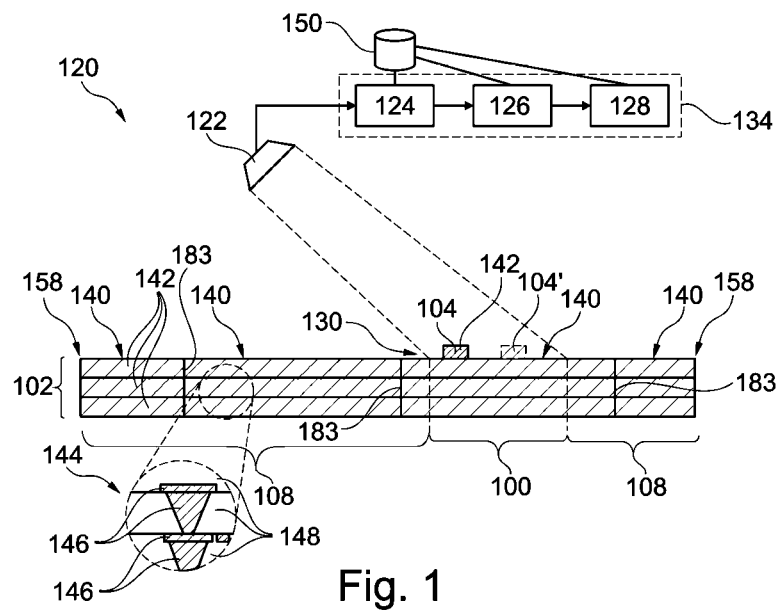
FIG. 1 illustrates an apparatus for compensating misalignment during manufacturing component carriers according to an exemplary embodiment of the invention at a first stage during the manufacturing process.

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

When creating structural features of a component carrier of a component carrier structure during the manufacturing process, it may happen that the spatial properties of such structural features are spatially misaligned with respect to target properties as defined in a target design. Such a target design may for instance be a set of parameters, for instance a data file, defining a specification which the component carrier to be manufactured shall meet. An example for such a misalignment is an erroneous position which a component to be embedded assumes in a cavity of a layer stack of the component carrier structure. Such an artefact may have the consequence that a vertical connection for electrically contacting the embedded component may be subsequently formed at a wrong position. This may have an undesired negative impact on the functionality of the manufactured component carriers.

In order to at least partially overcome such and/or other shortcomings, an exemplary embodiment scans a surface region of the component carrier structure, i.e. a region of interest, including a critical structural feature being a candidate for misalignment. For instance, such a scanning may be an optical scanning, a scanning by X-rays, computed tomography (CT), a scanning by ultrasound, etc. For instance, scanning the potentially misaligned structural feature may be limited to a region of interest, for instance a region of the component carrier structure including the potentially misaligned structural feature as well as the electric path up to said structural feature. The actual misalignment of said structural feature may then be determined as a deviation between spatial target properties according to the target design and real or actual spatial properties of the formed structural feature on the component carrier structure. The focus of the determination of a misalignment may be advantageously on the rotation and the shift of the misaligned structural feature (for instance a component) as determined based on unique processed data from the scanning. To avoid edge and/or boundary distortions, the method may make a global adjustment (in particular on array level, card level or panel level) of the image, for instance using an optimization algorithm taking into account the local shift and/or rotation for the single component partially correlated to the global scale. Rather than correcting a position of the spatially and/or rotationally erroneously arranged or misaligned structural feature, an exemplary embodiment maintains the misaligned feature on the component carrier structure without modification, but in contrast to this recalculates the target design concerning a future part of the manufacturing process so that the misaligned structural feature is redefined as fully correctly positioned in accordance with a modified target design. In order to avoid functional problems of the component carrier being presently manufactured, the modified target design may partially or completely compensate for the detected misalignment of the structural feature by changing the target design of one or more further structural features which are correlated with the misaligned structural features and which are to be manufactured subsequently. Descriptively speaking, said subsequently produced structural features correlated with the misaligned structural feature(s) may be intentionally misaligned as well (for instance by applying a corresponding spatial and/or rotational shift) so that the mutual spatial relationship between the misaligned feature(s) and the one or more correlated features to be produced subsequently match. For instance, when the above-mentioned embedded component is misaligned, the vertical connection for contacting the misaligned embedded component is misaligned in a corresponding way by imposing a corresponding rotation and/or shift. The future processing of the component carrier structure may be readjusted to take into account past misalignment. In other words, the misalignment is not corrected by physically rearranging the misaligned structural feature at a correct position and/or in a correct orientation on the component carrier structure. In contrast to this, the future processing of one or more (still virtual) structural features being correlated with (in particular being electrically coupled with) the misaligned structural feature may be changed or amended to comply with the accepted misalignment of the structural feature. The rest of the component carrier design, i.e. further structural features being not correlated with the misaligned structural feature, may remain unchanged. This may keep the computational effort of redefining the target design small. Hence, an exemplary embodiment may carry out a local correction limited to the environment of the misaligned structural feature and relating to rotation and/or shift, thereby for instance preventing issues at an edge of the designed component carrier. In particular at said edges, a global modification of the design might have an undesired impact on one or more structural features arranged at said edge. Thus, the target redesign may be limited in an embodiment to a region of interest around a misaligned structural feature.

According to an exemplary embodiment of the invention, a registration process and a corresponding registration station for manufacturing component carriers (in particular for embedding or packaging) may be provided. Embedding/packaging may involve critical designs with small annular rings that require high alignment accuracy. This problem has been conventionally treated in a limited way, as alignment has been traditionally considered as a "method" rather than as a "process". According to an exemplary embodiment of the invention however, the registration for component carrier manufacture (in particular for embedding/packaging) is developed as a separated process that corrects at least part of previous process errors and prepares a proper (in particular the best) fitting design to the next processing stage(s).

A compensation or registration process according to an exemplary embodiment of the invention can be implemented as a separated station in a manufacturing apparatus after assembly and press, which may be main processes involving placement error and dimensional changes. Once a final position of components (such as semiconductor chips) of a package is fixed in a cavity of a component carrier structure, a scanner (such as a vision system) may detect a position of misplacement according to photo marks. A data file including a corresponding shift and/or rotation of a misaligned structural feature may then be generated. A target design (for instance a CAM design) may be updated correspondingly, for instance making use of personalized software.

A gist of an exemplary embodiment of the invention is the execution of a two-stage alignment for component carrier manufacture, in particular for advanced applications (such as embedding and/or packaging). A corresponding alignment process or station may be configured for carrying out the alignment procedure, for instance in the scenario of an embedded component (or an embedded PCB, printed circuit board) which may be estimated to shift and rotate within a cavity of a layer stack of the component carrier structure. Advantageously, an exemplary embodiment of the invention may correct first the location of the misaligned structural feature (for instance an embedded component within its cavity (in particular of a frame, card, array)) first independently on how this structural feature is distorted within the component carrier structure (in particular on how a card, array or frame is distorted within a panel). Indeed, the alignment of the latter may be carried out in a second stage using for instance local or global alignment. For example, it may be possible to scan a component image, but to only calculate a main shift and a rotation induced by previous processes, and to update them in the target design. In particular, an exemplary embodiment of the invention may seek to compensate resulting errors from a photolithographic feature formation, and/or assembly and embedding processes. Misalignment of features may also result from copper processes and/or uneven surfaces.

In particular, an exemplary embodiment of the invention may carry out a process for compensating errors resulting from photolithographic feature formation, assembly and embedding processes. In this context, laser direct imaging (LDI) may be carried out highly advantageously. This may allow obtaining an alignment in an advanced and flexible way. An exemplary embodiment may apply adaptive imaging for alignment.

In another embodiment, when a design gets updates by a processing station, it can be also printed on films and glass plates. In such a scenario, using LDI may not be required or mandatory.

More specifically, an exemplary embodiment of the invention may introduce a two-stage alignment procedure when having an embedded component (or PCB) which is estimated to shift and rotate within a cavity in which the component is received. A gist of an exemplary embodiment is to correct first the location of the component within its cavity formed in a region of interest (such as a frame, a card, or an array) first independently on how this region of interest is distorted within a component carrier structure (such as a panel). In an embodiment, the alignment of the latter may be done in a second stage, for instance using either local or global alignment. In particular, a preferred embodiment of the invention may calculate a shift and a rotation of one or more structural features (such as a component in a cavity) in comparison with an original target design induced by previous processes. It is then possible to update the target design as a compensation for one or more subsequently processed other structural features, which may be functionally correlated with the previously mentioned one or more structural features.

Figure 2:
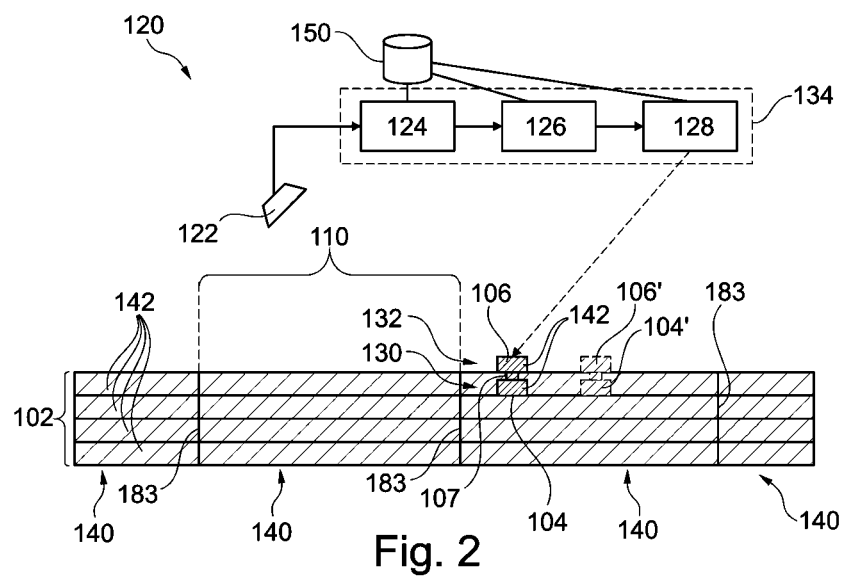
FIG. 2 illustrates the apparatus of FIG. 1 at a second stage during the manufacturing process.

FIG. 1 illustrates an apparatus 120 for compensating misalignment during manufacturing component carriers according to an exemplary embodiment of the invention at a first stage during the manufacturing process. FIG. 2 illustrates the apparatus 120 of FIG. 1 at a second stage during the manufacturing process.

The apparatus 120 is configured for compensating misalignment which may occur during manufacturing component carriers, such as printed circuit boards (PCB). During manufacture, component carriers to be manufactured may form part of an integral structure such as a panel, which may be denoted as a component carrier structure 102. Such a component carrier structure 102 is shown in a cross-sectional view in FIG. 1 and FIG. 2 during manufacture. Reference sign 140 corresponds to a respective region of the component carrier structure 102 which may form a component carrier after completion of the manufacturing process and after separation of the component carrier structure 102 into multiple separate component carriers at separation lines 183.

The component carrier structure 102 may be embodied as a plate-shaped laminate-type layer stack of layer structures 142. As illustrated schematically by detail 144, the laminated stack of layer structures 142 can be composed of electrically conductive layer structures 146 and electrically insulating layer structures 148. For example, the electrically conductive layer structures 146 may comprise patterned copper foils, one or more vertical through connections (for example copper filled laser vias), etc. The electrically insulating layer structures 148 may comprise a resin (such as epoxy resin), optionally comprising reinforcing particles therein (for instance glass fibers or glass spheres). For instance, the electrically insulating layer structure 148 may be made of prepreg or FR4. The layer structures 142 may be connected by lamination, i.e. the application of pressure and/or heat.

The apparatus 120 comprises an image detection unit 122 configured for detecting an image of a region of interest 100 (ROI) of the component carrier structure 102 during manufacturing the component carriers based on the component carrier structure 102. For instance, the image detection unit 122 may be an optical image detection unit such as one or more cameras. The image detection unit 122 may capture image data and may transmit said image data of the region of interest 100 to a processor 134 for data processing. The individual constituents of the processor 134, which will be described below in further detail, are capable of exchanging data with a memory device 150, such as a mass storage unit (for instance a hard drive). A database may be stored on the memory device 150.

The processor 134 of the apparatus 120 comprises an identification unit 124 configured for identifying a specific structural feature 104 in the image of the region of interest 100, which structural feature 104 shows misalignment with respect to a predefined target design stored in the memory device 150. More specifically, the misalignment may be identified based on the results of comparing a target design of the misaligned structural feature 104 with an actual design of the structural feature 104 in the region of interest 100. For instance, a target design may be a data set stored in the memory device 150 and may indicate a specification of structural parameters, etc., based on which the component carriers shall be manufactured. The target design also includes information indicative of spatial properties of the structural feature 104. When the structural feature 104 is misaligned, its actual physical spatial properties differ from the target properties for this structural feature 104 as defined in the target design. The misalignment may be quantified in the identification unit 124 by determining one or more parameters being indicative of a deviation of actual spatial position of structural feature 104 as compared to its desired spatial position according to the target design. For instance, the misalignment may be determined in terms of a spatial shift and a rotation of the structural feature 104.

A compensation unit 126 of the processor 134 may be communicatively coupled with the identification unit 124 and may be configured for partially or entirely compensating the identified misalignment of the structural feature 104 by modifying the target design of one or more other correlated structural features 106 of the processed component carrier structure 102 to be manufactured subsequently. Said at least one correlated structural feature 106 is functionally correlated to said structural feature 104 showing misalignment. The compensation unit 126 may modify and update the target design in the storage unit 150 for the purpose of compensating misalignment.

A process control unit 128 of processor 134 may then control or carry out the next procedures of the manufacturing process for creating the one or correlated structural features 106 on the basis of the modified target design (which may differ from the initial target design). Preferably, the process control unit 128 may be configured for controlling formation of the at least one correlated structural feature 106 based on the modified target design by laser direct imaging (LDI). LDI may be denoted as a technology of conductor image exposure, in which the layout of the component carrier structure 102 is not photographed on the component carrier structure 102 as an image of a film template on a light-sensitive film, but formation of the structures of the at least one correlated structural feature 106 to be produced are controlled with a laser (for instance a digital laser or several lasers) and are burnt sequentially into a photosensitive film. For instance, this may be accomplished by one or laser diodes, whose concentrated light is deflected by digitally controlled lenses or special optical systems. The capacity of such machines depends on the number of laser diodes and a mirror system used. Characteristic of the laser light is a fixed, delimited wavelength range of the light, for example 410 nm.

For instance, the structural feature 104 is a section of a patterned copper foil. The correlated structural feature 106 may be a plated surface portion of the laminated stack. As shown in FIG. 2, the structural feature 106 is produced in the same region of interest 100 in which also the misaligned structural feature 104 is located and which has been scanned by the image detection unit 122.

In FIG. 1 and FIG. 2, reference sign 104 thus indicates the actual position of the misaligned structural feature 104 of layer structure 130. Reference sign 104' indicates the target position of the structural feature 104 as defined in the initial target design (before its modification or up-date), i.e. the position where the structural feature 104 should be located in the absence of misalignment. After the manufacturing process resulting in the structure shown in FIG. 1 and after the operation of image detection unit 122, identification unit 124 and compensation unit 126 as described above, the target design is modified or updated. Furthermore, reference sign 106 in FIG. 2 indicates a modified target position at which correlated structural feature 106 is formed on layer structure 132 (above layer structure 130) when carrying out the manufacturing process on the basis of the modified or updated target design. Reference sign 106' indicates an initial target position for structural feature 106 according to the initial target design, i.e. before the modification or update. As shown, the compensation process does not correct the position of structural feature 104 on component carrier structure 102, but keeps the erroneously formed structural feature 104 at its misaligned position. In contrast to this, the compensation process compensates said misalignment by changing the target position of structural feature 106 which is functionally correlated with structural feature 104 in the readily manufactured component carrier. This correlation results for instance from an electric coupling of structural feature 104 with correlated structural feature 106 by electrically conductive connection element 107, see FIG. 2. In order to keep the functionality of the manufactured component carrier intact, the target position of correlated structural feature 106 is modified in such a way in the modified target design that correlated structural feature 106 is misaligned in a corresponding way as structural feature 104 and is thereby properly connected with structural feature 104 via electrically conductive connection element 107. In other words, misaligned structural feature 104 is not repaired to be aligned, but in contrast to this the target position of correlated structural feature 106 is adjusted in the amended design rules or target design so that the misalignment of structural feature 104 is taken into account for ensuring functioning of the manufactured component carrier. Thus, the described compensation process redefines the misaligned structural feature 104 as complying with a target alignment according to the modified target design (but not with the initial target design).

In the shown embodiment, the misalignment is a positional displacement, i.e. a horizontal displacement between the actual position of the structural feature 104 and its target position in accordance with the original target design. However, it is additionally or alternatively also possible that the compensation of the misalignment compensates a rotational misalignment with regard to a target orientation and/or a tilting of the misaligned structural feature 104 with respect to an angular target characteristic.

As can be taken from FIG. 1, the identification of the misaligned structural feature 104 occurs in a presently processed layer structure 130 of the component carrier structure 102. As can be derived from FIG. 2, the compensation of the misalignment may be accomplished by effecting formation of the correlated structural feature 106 in a subsequently processed layer structure 132. In the shown embodiment, layer structure 132 is a higher layer structure in relation to the presently processed layer structure 130 of the component carrier structure 102. Thus, processing of the later formed layer structure 132 is carried out to compensate for a misalignment of the previously processed layer structure 130.

Advantageously, an embodiment of the invention may modify the target design exclusively within the region of interest 100, not in other regions 108 of the component carrier structure 102. This keeps the computational burden of updating the target design reasonably small. Furthermore, this may prevent problems with the modified design in etch regions 158 of the component carrier structure 102 where a shift or displacement of a position of the correlated feature 106 might result in the formation of a correlated feature 106, for compensation purposes, such as an excessively lateral position on the component carrier structure 102.

In an alternative embodiment, it may be possible to modify the target design not only within the region of interest 100, but also in an extended region 110 (see FIG. 2) of the component carrier structure 102 extending beyond the region of interest 100 (see FIG. 1). This may compensate for effects of a modification of the target design for misalignment compensation also in connected regions of the region of interest 100.

Although not shown, the described processing sequence of identifying and compensating may be iteratively repeated several times. For instance, a corresponding update of the target design may be carried out after each formation of a respectively further layer structure, i.e. repeatedly during the build-up of the layer stack.

As can be seen in FIG. 1 and FIG. 2, the misalignment compensating method is preferably carried out on panel level, using a panel as component carrier structure 102, before separating the panel into the individual component carriers. Thus, misalignment compensation may be accomplished highly efficiently on a batch level. More specifically, misalignment compensation may be carried out repeatedly during build up, i.e. for each added layer structure. Consequently, the method comprises laminating further layer structures 142 to the component carrier structure 102 after the compensating procedure relating to the previously laminated layer structure 142.

FIG. 3 to FIG. 6 show different views of a component carrier structure 102 during carrying out a method of compensating misalignment implemented in the process of manufacturing component carriers according to an exemplary embodiment of the invention. In this embodiment, the misaligned structural feature 104 is a component to be embedded in a laminated layer stack of the component carrier structure 102, whereas the correlated structural feature 106 (not shown in this embodiment) is a connection pad for electrically contacting said embedded component.

Figure 3:
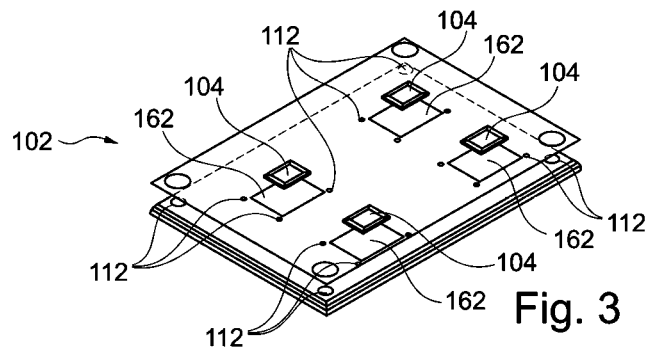
FIG. 3, FIG. 4, FIG. 5 and FIG. 6 show different views of a component carrier structure during carrying out a method of manufacturing component carriers including compensating misalignment according to an exemplary embodiment of the invention.

Referring to FIG. 3, component carrier structure 102 with alignment marks 112 and a plurality of cavities 162 is shown in which a plurality of electronic components (such as semiconductor chips) are to be embedded as structural features 104. FIG. 3 illustrates a first global alignment process. In the shown embodiment, the components are aligned with respect to the component carrier structure 102 based on the alignment marks 112 of the component carrier structure 102. More precisely, the alignment marks 112 are formed in corners of the component carrier structure 102 and adjacent to corners of the rectangular cavities 162. Thus, the alignment marks 112 may be detected and used for aligning the component carrier structure 102 with respect to the electronic components for forming the structural features 104 in form of the components embedded in cavity 162.

Figure 4:
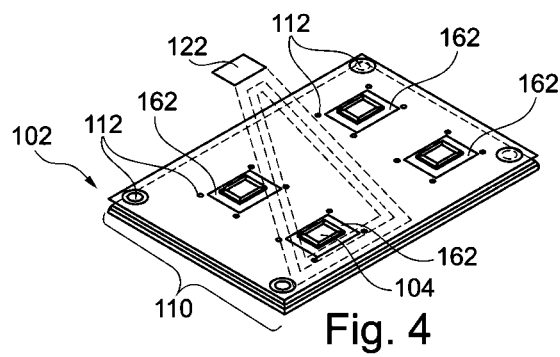

Referring to FIG. 4, image detection unit 122 is used as a scanning camera for carrying out a multiple area scan on the surface of the component carrier structure 102 shown in FIG. 4. An image correlation can be determined, i.e. a correlation of the component-type structural features 104 versus the alignment marks 112 and the cavities 162.

Figure 5:
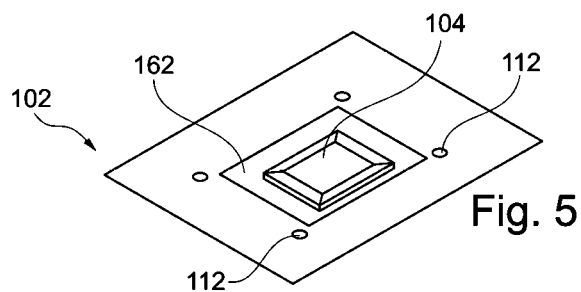

Referring to FIG. 5, a lay-up of scanned images is shown. As illustrated in FIG. 5, the component-type structural feature 104 is misaligned with respect to a center of the cavity 162, as it may be defined in a target design. This misalignment may be derived from the illustration of FIG. 5.

Figure 6:
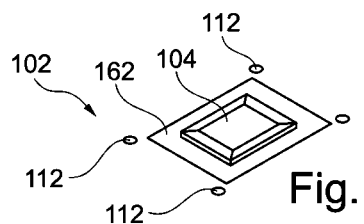

Referring to FIG. 6, an original target design is visually illustrated in which the component-type structure feature 104 is arranged in the center of the cavity 162. In order to compensate the misalignment shown in FIG. 5, the target design determining the manufacturing process may be modified for defining the subsequent formation of a vertical through connection for electrically contacting the embedded component-type structural feature 104 so that the misalignment is exactly compensated. More specifically, the vertical through connections form a correlated structural feature 106 (not shown in FIG. 6) for the structural feature 104. In order to properly connect the misaligned components, said vertical through connections are formed at a different position as compared to the original target design, wherein this changed position is defined in the updated or modified target design.

FIG. 3 to FIG. 6 introduce an advanced registration concept that can even correct alignment errors from previous processes. This concept is based on an AOI (automatic optical inspection) alignment concept.

In a first procedure, a scan and an image correlation may be carried out after pressing and tape removal. Thus, the panel or package may be scanned, and the generated image may be compared with an original software-based CAM (computer aided manufacturing) design. For example, only the shift and rotation of the misaligned feature 104 as compared to its predefined spatial target characteristics may be considered (for instance without scaling).

In a second procedure, a design update is carried out. If the scan shows shift and rotation of the component (for instance a chip or a package), then the new positions may be advantageously considered. The components may be shifted and/or rotated according to the measurements. The corresponding process is shown in FIG. 3 to FIG. 6.

In a third procedure, subsequent processing of the component carrier structure 102 is carried out. For the subsequent processing, the new or updated target design may be used, in particular to generate the exposure film and laser programs. Therefore, the errors of misalignment from the previous procedures may be deleted, and the new processes may define a new baseline to start with.

Figures 7, 8, 9:
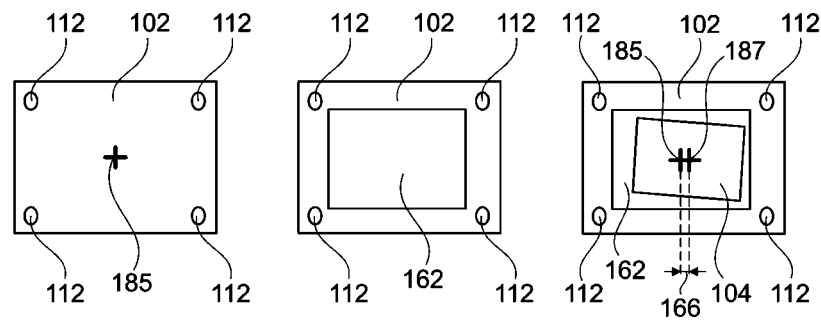
FIG. 7, FIG. 8 and FIG. 9 illustrates a process flow of a method of compensating misalignment of a structural feature formed during manufacturing component carriers according to an exemplary embodiment of the invention.

FIG. 7 to FIG. 9 illustrate a process flow of a method of compensating misalignment during manufacturing component carriers according to an exemplary embodiment of the invention.

Referring to FIG. 7, a plan view of a component carrier structure 102 with alignment markers 112 is shown. Also, a target center 185 for a component-type structural feature 104 to be assembled is illustrated.

Referring to FIG. 8, a cavity 162 may be cut in the component carrier structure 102 of FIG. 7.

Referring to FIG. 9, a component-type structural feature 104 may be assembled in the cavity 162. However, as indicated by reference sign 166, a misalignment of structural feature 104 may occur. This misalignment is a shift between the above explained target center 185 and actual center 187 of the structural feature 104. In addition to the spatial shift type misalignment, structural feature 104 is also rotationally misaligned.

In order to compensate the misalignment 166 illustrated in FIG. 9, an updated CAM (computer aided manufacturing) target design may be created by shifting and rotating each structural feature 104 according to the scanned values. Subsequent processing of the component carrier structure (for instance drilling and exposing for creating electrically conductive connection elements, as correlated structural features 106, for contacting the component-type structural feature 104) may then be formed in accordance with the updated target design.

As shown in FIG. 9, identifying the structural feature 104 showing the misalignment comprises determining a shift (see reference sign 166) and a rotation (compare edges of structural feature 104 in comparison with edges of cavity 162) of the structural feature 104 in cavity 162 of the component carrier structure 102 with respect to the target design. More specifically, compensating the identified misalignment comprises modifying the target design for partially or entirely compensating said shift and said rotation.

Figure 10:
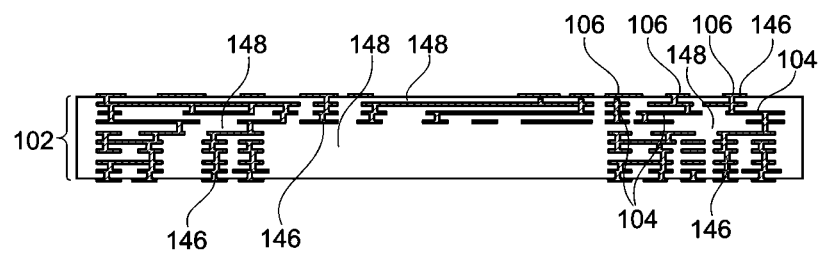
FIG. 10 shows a cross-sectional view of a component carrier structure with a misaligned structural feature, wherein said misalignment may be compensated according to an exemplary embodiment of the invention by changing a target design for forming a correlated feature above.

FIG. 10 shows a cross-sectional view of a component carrier structure 102 according to an exemplary embodiment of the invention with a misaligned structural feature 104. Said misalignment may be compensated by changing a target design for forming a correlated feature 106 above. According to FIG. 10, the misaligned structural feature 104 is a high-density integration portion of a laminated layer stack. The correlated structural feature 106 is a connected electrically conductive layer structure.

Figure 11:
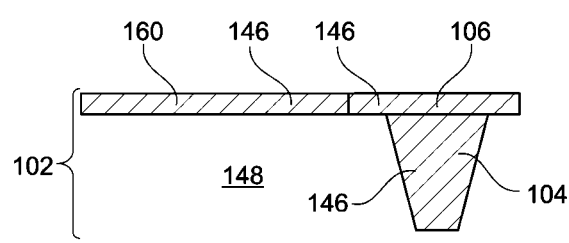
FIG. 11 shows a cross-sectional view of another component carrier structure with a misaligned structural feature, wherein said misalignment may be compensated according to an exemplary embodiment of the invention by changing a target design for forming a correlated feature above.

FIG. 11 shows a cross-sectional view of another component carrier structure 102 with a misaligned structural feature 104. Said misalignment may be compensated by changing a target design for forming a correlated feature 106 above. In the embodiment of FIG. 11, the misaligned structural feature 104 is a plated through-hole, for instance a copper filled laser via. The assigned correlated structural feature 106 is an electrically conductive pad connected with an electrically conductive horizontal trace 160.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of compensating misalignment during a manufacturing process of a laminate-type component carrier, the method comprising:
    detecting an image of a region of interest of a component carrier structure during manufacturing of the component carrier based on the component carrier structure;
    identifying a structural feature in the image of the region of interest showing misalignment of the structural feature with respect to a target design; and
    at least partially compensating the identified misalignment of the structural feature by modifying the target design of at least one correlated structural feature to be manufactured subsequently during the manufacturing process, wherein the at least one correlated structural feature is correlated to said structural feature showing misalignment,
    wherein the method further comprises:
    identifying the misaligned structural feature in a presently processed layer structure of the laminate-type component carrier structure; and
    at least partially compensating the misalignment by effecting formation of the correlated structural feature in a subsequently processed layer structure in relation to the presently processed layer structure, of the component carrier structure,
    wherein the method comprises iteratively repeating the identifying and the at least partially compensating for at least one further layer structure processed after processing the subsequently processed layer structure.

2. The method according to claim 1, further comprising: manufacturing the at least one correlated structural feature based on the modified target design.

3. The method according to claim 1, further comprising: manufacturing the at least one correlated structural feature in the region of interest.

4. The method according to claim 1, wherein the misalignment comprises at least one of the group consisting of a positional displacement with respect to a target position, a rotational misalignment with respect to a target orientation, and a tilting of the misaligned structural feature with respect to a target angular characteristic.

5. The method according to claim 1, further comprising: compensating by modifying the target design exclusively within the region of interest, not in other regions of the component carrier structure.

6. The method according to claim 1, further comprising: compensating by modifying the target design in an extended region of the component carrier structure extending beyond the region of interest, wherein the extended region is a quarter panel of a panel-type component carrier structure.

7. The method according to claim 1, further comprising: aligning the component carrier structure based on one or more alignment marks of the component carrier structure.

8. The method according to claim 7, further comprising: aligning the component carrier structure for forming the structural feature and/or for forming the correlated structural feature.

9. The method according to claim 1, wherein the method comprises identifying the misalignment based on a result of comparing the target design of the misaligned structural feature with an actual design of the structural feature.

10. The method according to claim 1, wherein the misaligned structural feature is a component to be embedded in the component carrier structure, and the correlated structural feature is a connection pad for connecting the component.

11. The method according to claim 1, wherein the misaligned structural feature is a plated through-hole, and the correlated structural feature is an electrically conductive trace and/or a pad.

12. The method according to claim 1, wherein the misaligned structural feature is a high-density integration portion, and the correlated structural feature is an electrically conductive layer structure connected to the high-density integration portion.

13. The method according to claim 1, wherein the method comprises at least partially compensating the misalignment during processing the component carrier structure by at least one of the group consisting of imaging, solder mask treatment, screen printing, and mechanically treating by drilling and/or in an assembly process, the component carrier structure.

14. The method according to claim 1, wherein the component carrier structure is selected from a group consisting of a panel for manufacturing component carriers, an array of multiple component carriers or preforms thereof, and a component carrier for carrying at least one component.

15. The method according to claim 1, wherein the method redefines the misaligned structural feature as complying with a target alignment according to the modified target design.

16. The method according to claim 1, comprising at least one of the following features:
wherein the method comprises manufacturing the at least one correlated structural feature based on the modified target design by laser direct imaging;
wherein the method is carried out on panel or array level, using a panel or an array as component carrier structure, before separating the panel or the array into the individual component carriers;
wherein identifying the structural feature showing the misalignment comprises determining a shift and a rotation of the structural feature in a cavity of the component carrier structure with respect to the target design, wherein at least partially compensating the identified misalignment comprises modifying the target design for at least partially compensating said shift and said rotation;
wherein the method comprises laminating at least one further layer structure to the component carrier structure after the compensating;
wherein the method comprises at least partially compensating the identified misalignment of the structural feature by modifying the target design by at least one of the group consisting a compensating positional shift, a compensating rotation, and a compensating tilting of the at least one correlated structural feature;
wherein the region of interest is only a sub-portion of the component carrier structure or is the entire component carrier structure.

17. An apparatus for compensating misalignment during manufacturing of a laminate-type component carrier based on a pre-defined target design, the apparatus comprising:
an image detection unit configured for detecting an image of a region of interest of a component carrier structure during manufacturing of the component carrier based on the component carrier structure;
an identification unit configured for;
identifying a structural feature in the image of the region of interest showing misalignment of the structural feature with respect to the predefined target design; and
identifying the misaligned structural feature in a presently processed layer structure of the laminate-type component carrier structure; and
a compensation unit configured for:
at least partially compensating the identified misalignment of the structural feature by modifying the target design of at least one correlated structural feature to be manufactured subsequently during manufacturing of the component carrier, wherein the at least one correlated structural feature is correlated to said structural feature showing misalignment, and
at least partially compensating the misalignment by effecting formation of the correlated structural feature in a subsequently processed layer structure in relation to the presently processed layer structure, of the component carrier structure;
wherein the apparatus is configured for iteratively repeating the identifying and the at least partially compensating for at least one further layer structure processed after processing the subsequently processed layer structure.

18. A non-transitory program element stored on a non-transitory computer-readable medium, which non-transitory program element, when being executed by one or a plurality of processors, is adapted to carry out or control a method for compensating misalignment during the manufacture of a laminate-type component carrier, the method comprising:
detecting an image of a region of interest of a component carrier structure during manufacturing of the component carrier based on the component carrier structure;
identifying a structural feature in the image of the region of interest showing misalignment with respect to a target design; and
at least partially compensating the identified misalignment of the structural feature by modifying the target design of at least one correlated structural feature to be manufactured subsequently during the manufacture of the component carrier, wherein the at least one correlated structural feature is correlated to said structural feature showing misalignment,
identifying the misaligned structural feature in a presently processed layer structure of the laminate-type component carrier structure; and
at least partially compensating the misalignment by effecting formation of the correlated structural feature in a subsequently processed layer structure in relation to the presently processed layer structure, of the component carrier structure,
wherein the method comprises iteratively repeating the identifying and the at least partially compensating for at least one further layer structure processed after processing the subsequently processed layer structure.

19. A method of compensating misalignment during manufacturing process of a laminate-type component carrier, wherein the method comprises:
detecting an image of a region of interest of the component carrier structure during manufacturing of the component carrier based on the component carrier structure;
identifying a structural feature in the image of the region of interest showing misalignment of the structural feature with respect to a target design; and
at least partially compensating the identified misalignment of the structural feature by modifying the target design of at least one correlated structural feature to be manufactured subsequently during the manufacturing process,
wherein the at least one correlated structural feature is correlated to said structural feature showing misalignment,
wherein the misaligned structural feature is a plated through-hole, and the correlated structural feature is an electrically conductive trace and/or a pad.

* * * * *